(12) United States Patent
Chia et al.

(10) Patent No.: US 11,404,350 B2
(45) Date of Patent: Aug. 2, 2022

(54) HIGH IMPACT RESISTANT HEAT SINK

(71) Applicant: Cisco Technology, Inc., San Jose, CA (US)

(72) Inventors: Vic Chia, Sunnyvale, CA (US); Hong Huynh, Fremont, CA (US); Steven A. Hanssen, San Jose, CA (US); Robert Gregory Twiss, Chapel Hill, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 118 days.

(21) Appl. No.: 16/913,663

(22) Filed: Jun. 26, 2020

(65) Prior Publication Data

US 2020/0328136 A1 Oct. 15, 2020

Related U.S. Application Data

(60) Continuation of application No. 16/137,650, filed on Sep. 21, 2018, now Pat. No. 10,734,306, which is a
(Continued)

(51) Int. Cl.
*H01L 23/40* (2006.01)
*F16B 5/02* (2006.01)

(52) U.S. Cl.
CPC ........ *H01L 23/4006* (2013.01); *F16B 5/0266* (2013.01); *H01L 2023/4081* (2013.01); *H01L 2023/4087* (2013.01)

(58) Field of Classification Search
CPC ............. F16B 21/18; H01L 2023/4081; H01L 2023/4087; H01L 23/4006
See application file for complete search history.

(56) References Cited

U.S. PATENT DOCUMENTS 5,109,317 A 4/1992 Miyamoto et al.
5,901,039 A 5/1999 Dehaine et al.
(Continued)

FOREIGN PATENT DOCUMENTS

GB 2396482 A 6/2004

OTHER PUBLICATIONS

Michael J. Maloney, "Fastening Hardware for Heat Sink Assembly", 2011 PennEngineering, www.pemnet.com, 6 pages.
(Continued)

*Primary Examiner* — Schyler S Sanks
(74) *Attorney, Agent, or Firm* — Edell, Shapiro & Finnan, LLC (57) ABSTRACT

A heat sink mounting configuration is provided that is configured to prevent the heat sink from damaging ball grid arrays (BGA) of an application specific integrated circuit (ASIC) mounted on a printed circuit board (PCB) when the line card is subjected to vibrations and shocks. The heat sink mounting configuration may include a set of screws configured to be at least partially disposed within the apertures of the heat sink to secure the heat sink to the PCB. The mounting configuration includes a resilient member and a spacer disposed around the screws proximate to the apertures. The resilient members are configured to bias the heat sink against the ASIC to maintain the heat sink in contact with the ASIC. The spacers are configured to prevent the heat sink from impacting the ASIC with forces large enough to damage the BGA when the line card is subjected to vibrations and shocks.

20 Claims, 7 Drawing Sheets

Related U.S. Application Data division of application No. 14/740,898, filed on Jun. 16, 2015, now Pat. No. 10,109,558.

(56) References Cited

U.S. PATENT DOCUMENTS

| | | |
|---|---|---|
| 6,374,906 B1 | 4/2002 | Peterson et al. |
| 6,404,634 B1 | 6/2002 | Mann |
| 6,590,771 B2 | 7/2003 | Sopko et al. |
| 6,644,903 B1 * | 11/2003 | Arand .................. F16B 5/0208 411/107 |
| 6,714,414 B1 | 3/2004 | Dubovsky et al. |
| 6,859,367 B2 | 2/2005 | Davison |
| 6,917,520 B2 | 7/2005 | Lin et al. |
| 7,518,872 B2 | 4/2009 | Tran et al. |
| 7,652,886 B2 | 1/2010 | Li et al. |
| 2002/0102147 A1 * | 8/2002 | Mayer .................... F16B 21/18 411/353 |
| 2009/0108429 A1 | 4/2009 | Tsao et al. |
| 2011/0188969 A1 | 8/2011 | Michalic et al. |
| 2012/0093609 A1 | 4/2012 | Trifilio et al. |
| 2013/0323964 A1 | 12/2013 | Cheng et al. |
| 2016/0374232 A1 | 12/2016 | Chia et al. |
| 2019/0027422 A1 | 1/2019 | Chia et al. |

OTHER PUBLICATIONS

"PEM Heat Sink Mounting System", Product Design & Development, Product Releases, http://www.pddnet.com/product-releases/2013/04/pem-heat-sink-mounting-system, 7 pages (last visited on Apr. 15, 2015).

* cited by examiner

HIGH IMPACT RESISTANT HEAT SINK

CROSS-REFERENCE TO RELATED APPLICATIONS

This application is a continuation of U.S. patent application Ser. No. 16/137,650, filed on Sep. 21, 2018, and entitled "High Impact Resistant Heat Sink," which is a divisional of U.S. patent application Ser. No. 14/740,898, filed on Jun. 16, 2015, and entitled "High Impact Resistant Heat Sink," the entirety of which are incorporated herein by reference.

TECHNICAL FIELD

The present disclosure relates to a heat sink design that prevents the heat sink from damaging the ball grid array of an application specific integrated circuit when the line cards in which the heat sink is installed is subjected to shocks, vibrations, and/or other forces.

BACKGROUND

Application specific integrated circuits (ASIC) are mounted onto printed circuit boards (PCB) of line cards by ball grid arrays (BGA). A BGA is a series of small spheres of solder placed on the bottom of an ASIC. The solder spheres may be held in place with a flux. The ASIC with the BGA is then placed on a PCB with copper pads that match the array design of the solder balls. Once heated, the solder spheres melt, and then, when the solder cools and solidifies, the solder spheres form soldered connections between the ASIC and the PCB. During use, ASICs can create a significant amount of heat. Thermally conductive heat sinks are typically installed over ASICs to draw the heat from the ASIC away from the ASIC, and is so doing, prevent ASICs from overheating during operation.

As ASICs increase in size and in processing power, the heat created by the ASICs also increases. Thus, the size of the heat sinks needed to properly dissipate the increased amount of heat output by an ASIC needs to also increase. However, as the heat sinks increase in size, the heat sinks increase in weight. The increased weight of heat sinks to compensate for the increased heat output by the ASICs is challenging as ASICs and line cards are subjected to shocks and vibrations, and/or unexpected forces from handling and transportation.

DESCRIPTION OF EXAMPLE EMBODIMENTS

Overview

A heat sink mounting configuration is provided that is configured to prevent the heat sink from cracking and damaging ball grid arrays (BGA) of an application specific integrated circuit (ASIC) mounted on a printed circuit board (PCB) when subjected to vibrations, shocks, and/or other forces. The heat sink mounting configuration may include a heat sink with at least one aperture. The heat sink mounting configuration may further include at least one screw member, where the screw member contains a head and a shank. The shank of the screw extends from the head of the screw and is insertable into the at least one aperture of the heat sink. Moreover, the heat sink mounting configuration may include at least one spacer that is disposed around the shank of the screw proximate to the at least one aperture of the heat sink. The mounting configuration also includes at least one resilient member that is disposed around the shank of the screw member.

Because heat sinks are typically secured to a PCB proximate to an ASIC with spring loaded screws, shock and vibrations imparted onto the PCB may cause the heat sink to overcome the biasing force of the springs, causing the bottom of the heat sink to separate from the ASIC. When the shocks and vibrations imparted onto the line card are no longer large enough for the weight of the heat sink to overcome the force of the springs, the springs cause the heat sink to return to its original position with a force combined of an induced force from the weight of the heat sink and the preload force from the spring. These combined forces may cause the heat sink to spring back to its original position and impact the ASIC with enough force to crack or damage the BGA. Thus, the placement of the spacers around the screws to limit the amount of movement of the heat sink prevents the heat sink from impacting the ASIC with forces large enough to crack the solder balls of the BGA.

Example Embodiments

Figure 1:
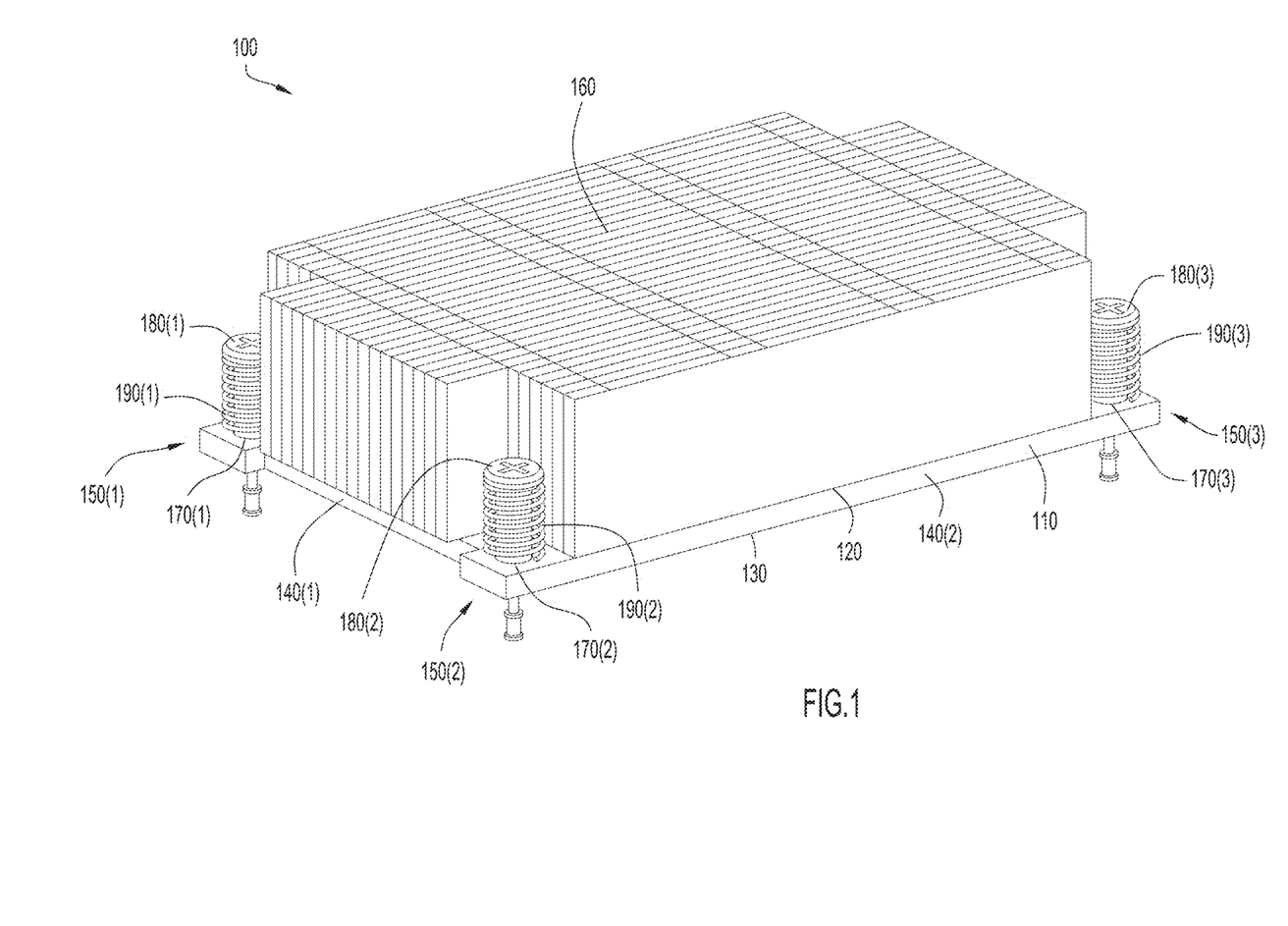
FIG. 1 illustrates a perspective view of a heat sink according to an example embodiment.

An example embodiment of a heat sink is illustrated in FIG. 1 and shown generally at reference numeral 100. As illustrated, the heat sink 100 includes a base 110 with a top surface 120, a bottom surface 130, and four sides 140(1)-140(4) that define four corners 150(1)-150(4). Disposed on, and extending upwardly from, the top surface 120 of the base 110 is a set of fins 160. At each one of the corners 150(1)-150(4) is a corresponding one of apertures 170(1)-170(4). The apertures 170(1)-170(4) are configured to extend through the base 110 from the top surface 120 to the bottom surface 130. As illustrated in FIG. 1, mounting screws 180(1)-180(4) are disposed at least partially within, and extending through, respective ones of the apertures 170(1)-170(4). Furthermore, resilient members 190(1)-

190(4) are disposed around corresponding ones of the screws 180(1)-180(4) proximate to the apertures 170(1)-170(4). Other embodiments of the heat sink may be of a shape that is different from the substantially rectangular shape of the heat sink 100 illustrated in FIG. 1. Thus, other embodiments of the heat sink may be substantially triangular, circular, spherical, etc. Moreover, the number of apertures on the heat sink may be greater or less than the four apertures 170(1)-170(4) described above, Referring now to FIG. 2, illustrated is an exploded view of the heat sink 100 and the associated mounting hardware. The screws 180(1)-180(4) of the heat sink 100 include heads 200(1)-200(4), shanks 210(1)-210(4), and bottom ends 220(1)-220(4). As illustrated, the heads 200(1)-200(4) of the screws 180(1)-180(4) have a larger diameter than the shanks 210(1)-210(4) of the screws 180(1)-180(4), which have a larger diameter than the bottom ends 220(1)-220(4) of the screws 180(1)-180(4). Furthermore, the apertures 170(1)-170(4) located at the corners 150(1)-150(4) of the base 110 of the heat sink 100 have a diameter that is equal to or larger than the diameter of the shanks 210(1)-210(4) of the screws 180(1)-180(4). However, the diameter of the apertures 170(1)-170(4) is less than the diameter of the heads 200(1)-200(4) of the screws 180(1)-180(4), which prevents the screws 180(1)-180(4) from sliding completely through the apertures 170(1)-170(4). Thus, the screws 180(1)-180(4) may be inserted into the apertures 170(1)-170(4) so that the bottom ends 220(1)-220(4) and the shanks 210(1)-210(4) of the screws 180(1)-180(4) at least partially extend through the apertures 170(1)-170(4), but the heads 200(1)-200(4) of the screws 180(1)-180(4) are not capable of being inserted through the apertures 170(1)-170(4).

Figure 2:
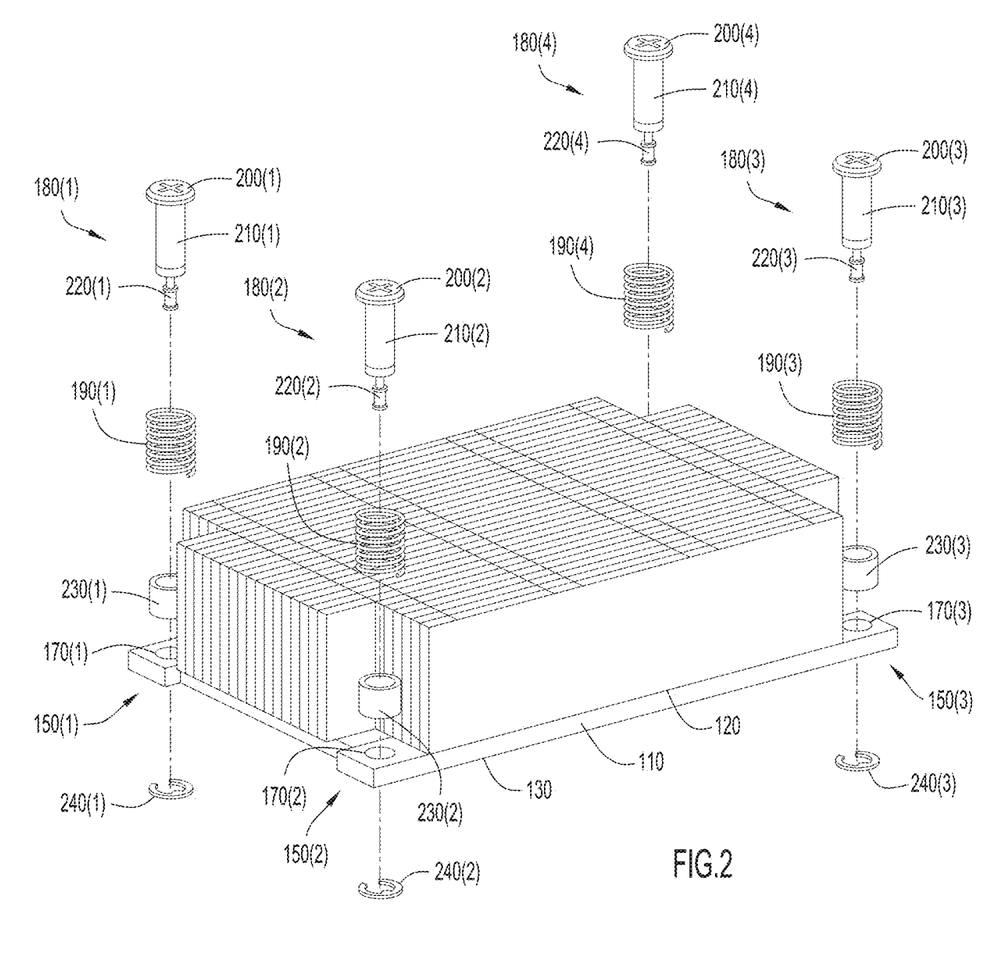
FIG. 2 illustrates an exploded view of the heat sink illustrated in FIG. 1 according to an example embodiment.

FIG. 2 further illustrates substantially cylindrical spacers 230(1)-230(4) that are hollow along their lengthwise axis. The spacers 230(1)-230(4) may be positioned proximate to the apertures 170(1)-170(4). Furthermore, the spacers 230(1)-230(4) have an outer diameter that is greater than the diameter of the apertures 170(1)-170(4), and an inner diameter that is equal to or greater than the diameter of the apertures 170(1)-170(4). Thus, the spacers 230(1)-230(4) are not configured to be inserted into or through the apertures 170(1)-170(4), and are configured to sit atop the top surface 120 of the base 110. Moreover, the inner diameter of the spacers 230(1)-230(4) is less than the diameter of the heads 200(1)-200(4) of the screws 180(1)-180(4). Therefore, the shanks 210(1)-210(4) and the bottom ends 220(1)-220(4) of the screws 180(1)-180(4) are configured to be at least partially inserted through the spacers 230(1)-230(4) to be at least partially inserted through the apertures 170(1)-170(4). However, because of the diameter of the heads 200(1)-200(4) of the screws 180(1)-180(4), the heads 200(1)-200(4) of the screws 180(1)-180(4) cannot be inserted through the spacers 230(1)-230(4). As will be further explained later, the spacers 230(1)-230(4) determine how far the screws 180(1)-180(4) extend through the aperture 170(1)-170(4), or how far the heat sink 100 travels up the shanks 210(1)-200(4) of the screws 180(1)-180(4).

Moreover, the resilient members 190(1)-190(4) are configured to be disposed around the spacers 230(1)-230(4). The resilient members 190(1)-190(4) are configured to contact the heads 200(1)-200(4) of the screws 180(1)-180(2) and the top surface 120 of the base 110 proximate to the apertures 170(1)-170(4). Thus, as the screws 180(1)-180(2) slide through the apertures 170(1)-170(4) and the spacers 230(1)-230(4), the heads 200(1)-200(4) of the screws 180(1)-180(4) move closer to the top surface 120 of the base 110, which compresses the resilient members 190(1)-190(4). The resilient members 190(1)-190(4) bias the heat sink 100 downward on the shanks 210(1)-210(4) of the screws 180(1)-180(4).

Further illustrated in FIG. 2 are clips 240(1)-240(4). The clips 240(1)-240(4) are configured to be coupled to the screws 180(1)-180(4) proximate to the connection of the shanks 210(1)-210(4) to the bottom ends 220(1)-220(4) of the screws 180(1)-180(4). Moreover, the clips 240(1)-240(4) are coupled to the screws 180(1)-180(4) proximate to the bottom surface 130 of the base 110 of the heat sink 100. The clips 240(1)-240(4) may be configured to prevent the heat sink 100 from sliding too far down the shanks 210(1)-210(4) of the screws 180(1)-180(4). In other words, the clips 240(1)-240(4) may prevent the screws 180(1)-180(4) from sliding out of the apertures 170(1)-170(4) of the heat sink 100 from the force of the resilient members 190(1)-190(4). In another embodiment, the screws 180(1)-180(4) may contain threads that span a substantial portion of the length of the shanks 210(1)-210(4).

Figure 3:
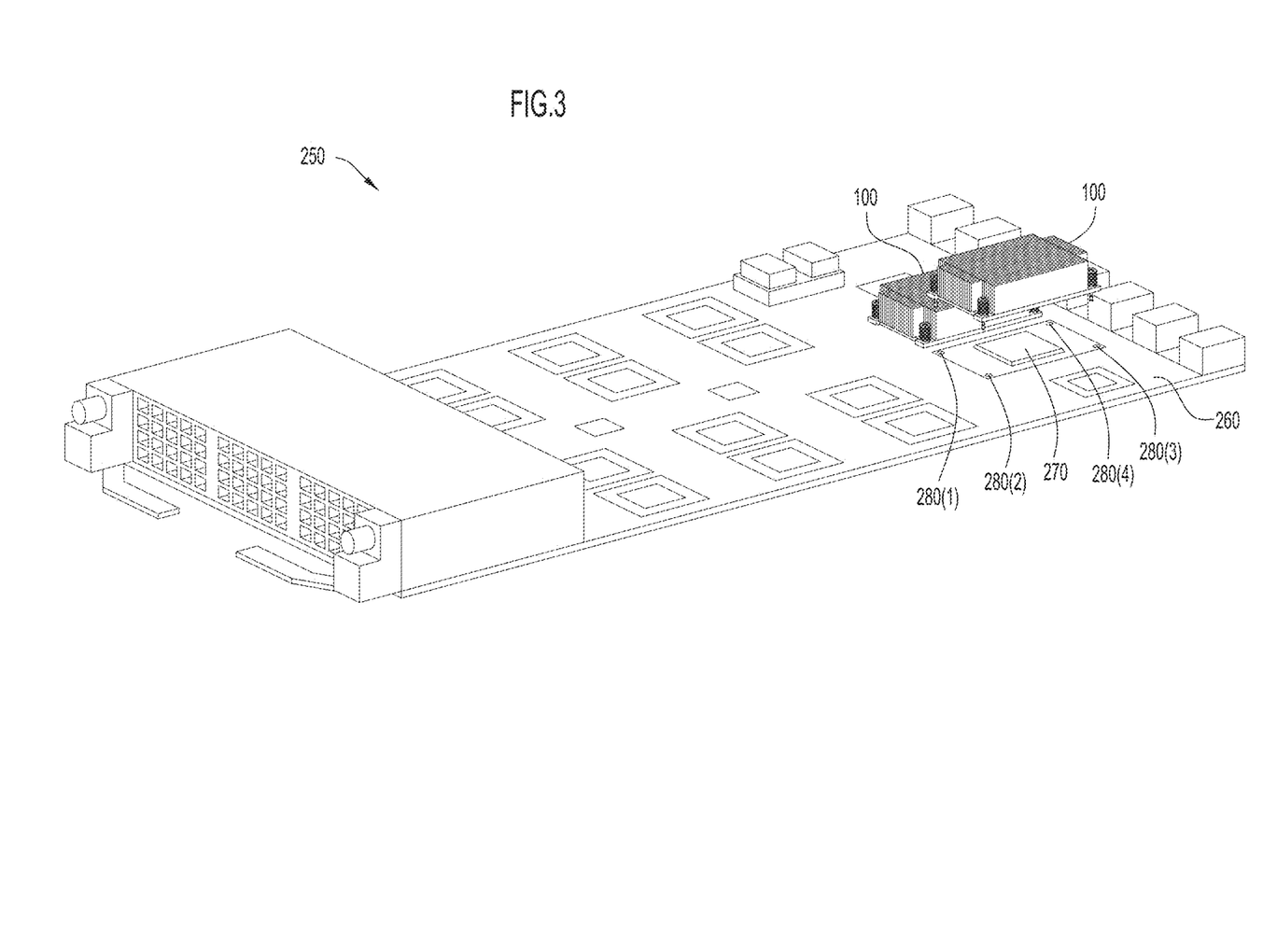
FIG. 3 illustrates the heat sink of FIG. 1 positioned on a printed circuit board, according to an example embodiment.

Turning to FIG. 3, the heat sink 100 of FIG. 1 is illustrated being mounted onto a line card 250. The line card 250 may include a printed circuit board (PCB) 260 and at least one application specific integrated circuit (ASIC) 270, or other ball-grid device, mounted on the PCB 260. As illustrated in FIG. 2, the PCB 260 further includes four openings 280(1)-280(4) spaced around the ASIC 270. The openings 280(1)-280(4) disposed around the ASIC 270 are configured to align with the apertures 170(1)-170(4) of the heat sink 100 and receive the bottom end 220(1)-220(4) of the screws 180(1)-180(4). In the embodiment where the shanks 210(1)-210(4) of the screws 180(1)-180(4) contain threads, the screws 180(1)-180(4) may be threaded into the openings 280(1)-280(4) of the PCB 260 to secure the screws 180(1)-180(4) and the heat sink 100 to the PCB 260. As illustrated, the heat sink 100 is configured to be displaced over the ASIC 270 mounted on the PCB 260.

Figure 4:
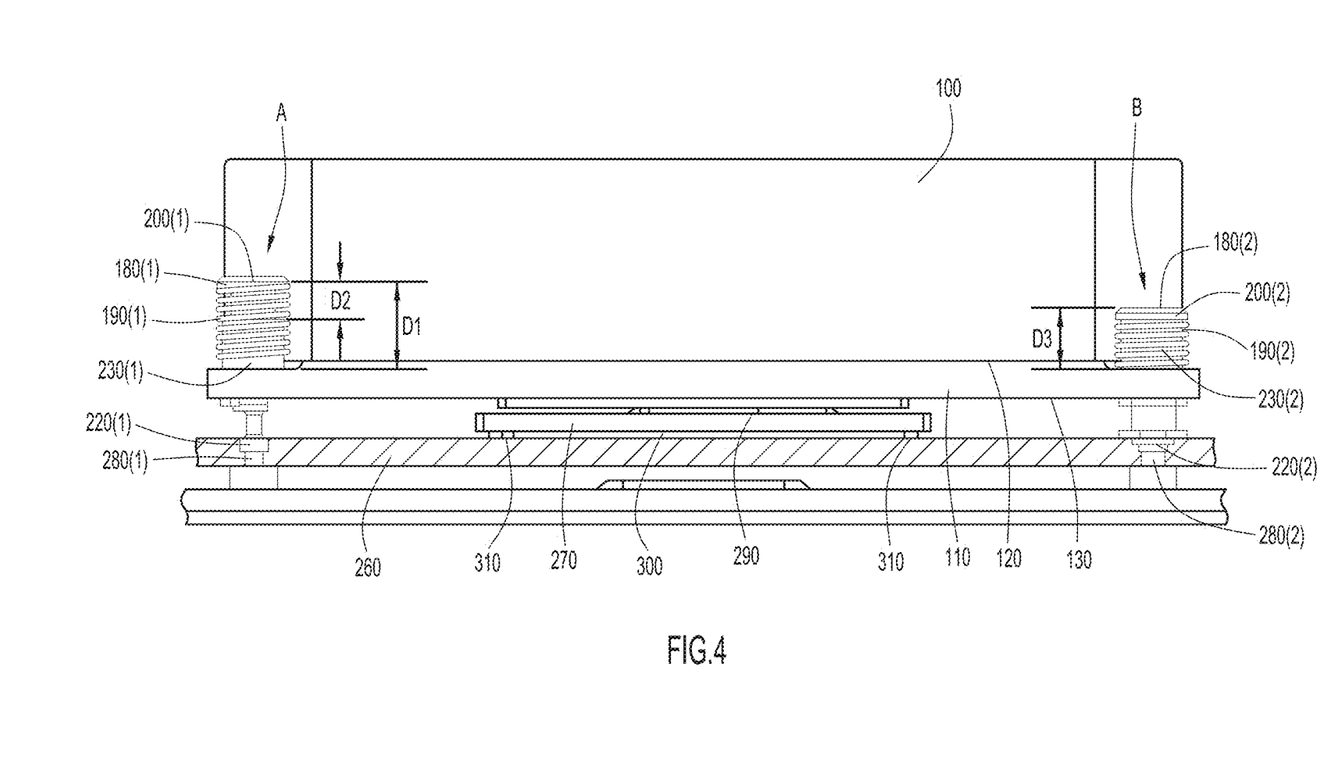
FIG. 4 illustrates a side view of the heat sink of FIG. 1 and positioned on a printed circuit board above an application specific integrated circuit, according to an example embodiment.

Turning to FIG. 4, illustrated is a side view of a heat sink 100 mounted onto a PCB 260 over an ASIC 270. The ASIC 270 includes a top surface 290 and a bottom surface 300. Moreover, disposed on the bottom surface 300 of the ASIC is a ball grid array (BGA) 310. The BGA 310 may be a series of small spheres of solder placed on the bottom surface 300 of an ASIC 270 in an array, pattern, or design. The solder spheres of the BGA 310 are configured to form a soldered connection between the ASIC 270 and the PCB 260. The solder spheres of the BGA 310 are configured to melt when heated, and then solidify once cooled, and in so doing coupling the ASIC 270 to the PCB 260. Furthermore, as illustrated in FIG. 4, the bottom surface 130 of the base 110 of the heat sink 100 is disposed over and proximate to the top surface 290 of the ASIC 270. The resilient members 190(1)-190(4) are configured to bias the bottom surface 130 of the heat sink 100 into contact with the top surface 290 of the ASIC 270.

Further illustrated in FIG. 4 is screw 180(1) and screw 180(2). Resilient member 190(1) is disposed around the screw 180(1) and resilient member 190(2) is disposed around the screw 180(2). In addition, spacer 230(1) is disposed around the screw 180(1) between the screw 180(1) and the resilient member 190(1) proximate to the top 120 of the base 110 of the heat sink 100. Spacer 230(2) is also disposed around the screw 180(2) between the screw 180(2) and the resilient member 190(2) proximate to the top 120 of the base 110 of the heat sink 100. Both screws 180(1), 180(2) extend through the base 110 of the heat sink 100, and are configured so the second ends 220(1), 220(2) of the screws 180(1), 180(2) are disposed within the openings 280(1), 280(2) of the PCB 260 to secure the heat sink 100 to the PCB 260 over the ASIC 270.

Figure 5A:
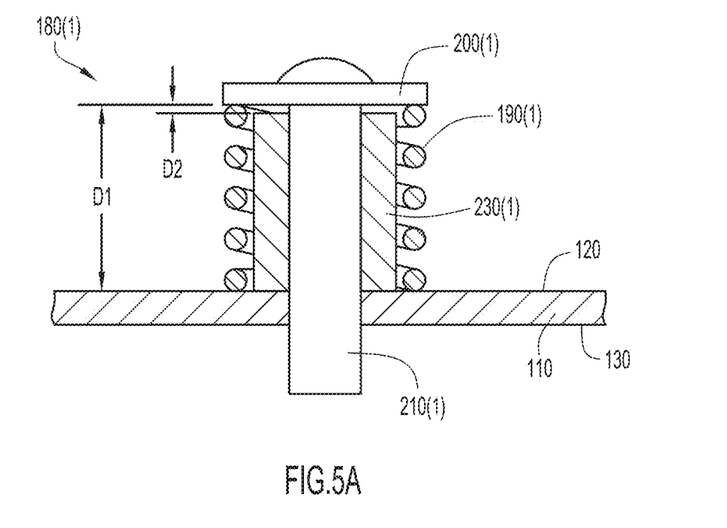
FIG. 5A illustrates a cross sectional view of a first example embodiment of a screw, spacer, and resilient member of the heat sink illustrated in FIG. 1.
Figure 5B:
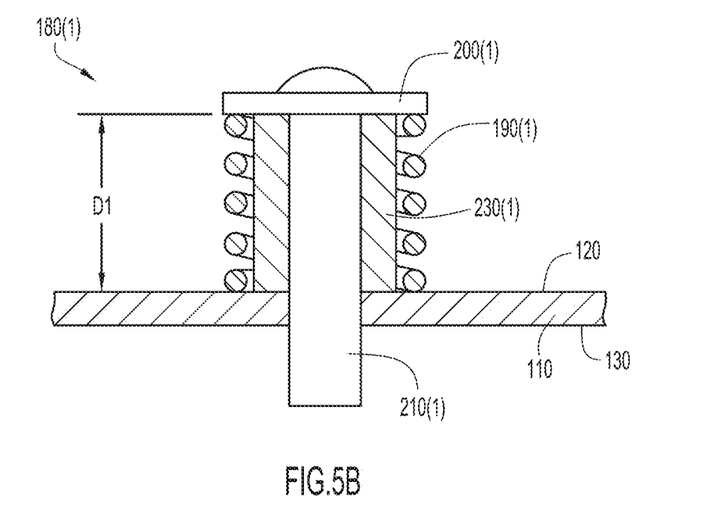
FIG. 5B illustrates a cross sectional view of a second example embodiment of a screw, spacer, and resilient member of the heat sink illustrated in FIG. 1.

For illustrative purposes only, FIG. 4 illustrates the head 200(1) of the screw 180(1) at a different distance from the top surface 120 of the base 110 than the head 200(2) of the screw 180(2). The relationship between the screw 180(1) and the heat sink 100 may represent the relationship between all the screws 180(1)-180(4) and the heat sink 100 when the heat sink 100 is in a first configuration shown at A in FIG. 5. The relationship between the screw 180(2) and the heat sink 100 illustrated in FIG. 4 may represent the relationship between all of the screws 180(1)-180(4) and the heat sink 100 when the heat sink 100 is in a second configuration shown at B in FIG. 5. As illustrated, when the heat sink 100 is disposed in the first configuration A, the head 200(1) of the screw 180(1) is disposed a distance D1 from the top surface 120 of the base 110 of the heat sink 100. Moreover, the head 200(1) of the screw 180(1) is disposed a distance D2 from the spacer 230(1). The distance D2 may be approximately 5-8 mils (thousandths of an inch). When the heat sink 100 is disposed in the second configuration B, the head 200(2) of the screw 180(2) is disposed a distance D3 from the top surface 120 of the base 110 of the heat sink 100. Moreover, the head 200(2) of the screw 180(2) is disposed proximate to the spacer 230(2). The difference between D1 and D3 is equal to D2.

Line cards 250 are sometimes subjected to external forces, which may be shocks or vibrations that are transmitted to the line cards 250. The external forces may be operational forces that are imparted onto the line card 250 when the line card 250 in operation. In addition, the external forces may be shocks or vibrations that occur when the line card 250 is not in operation. These non-operational external forces may be a result of the transportation or installation of the line card 250. The external forces that are placed on the line card 250, whether they are operational or non-operational forces, may be transmitted to the heat sink 100. When the line card 250 does not receive external forces, the heat sink 100 is disposed in the first configuration A, where the heads 200(1)-200(4) of the screws 180(1)-180(4) are disposed away from the top surface 120 of the base 110 of the heat sink 100 and away from the spacers 230(1)-230(4). In the first configuration A, the resilient members 190(1)-190(4) bias (physically force) the heat sink 100 towards the bottom ends 220(1)-220(4) of the screws 180(1)-180(4) so that the bottom surface 130 of the base 110 of the heat sink 100 remains in contact with the top surface 290 of the ASIC 270. Moreover, the heat sink 100 may also be disposed in the first configuration A when the line card 250 is subjected to external forces, but these external forces are not large enough to overcome the spring force of the resilient members 190(1)-190(4).

Conversely, when the external forces are large enough for the weight of the heat sink 100 to overcome the spring force of the resilient members 190(1)-190(4), the heat sink 100 travels along the shanks 210(1)-210(4) of the screws 180 (1)-180(4) so that the heads 200(1)-200(4) of the screws 180(1)-180(4) are located proximate to the spacers 230(1)-230(4). While not illustrated, as the heat sink 100 is reconfigured from the first configuration A to the second configuration B, the bottom surface 130 of the base 110 of the heat sink 100 moves away from the top surface 290 of the ASIC 270. Once the external forces stop, or are reduced to an amount that no longer overcomes the spring force of the resilient members 190(1)-190(4), the resilient members 190(1)-190(4) bias the heat sink 100 back to the first configuration A. When the heat sink 100 is returned to the first configuration A from the second configuration B, the bottom surface 130 of the base 110 of the heat sink 100 is returned into abutment with the top surface 290 of the ASIC 270, where the bottom surface 130 of the base 110 of the heat sink 100 impacts the top surface 290 of the ASIC 270 with a combined force of the spring forces of the resilient members 190(1)-190(4) and the force of the falling heat sink 100.

When the spacers 230(1)-230(4) are not installed on the screws 180(1)-180(4), the heat sink 100 may be able to travel the length of the shanks 210(1)-210(4), and the resilient members 190(1)-190(4) are able to fully compress when the heat sink 100 is in the second configuration B. Without the spacers, the combined force of the spring forces of the resilient members 190(1)-190(4) and the force of the falling heat sink 100 may be large enough to crack the BGA 310 when the heat sink 100 impacts the ASIC 270. However, when the spacers 230(1)-230(4) are disposed around the screws 180(1)-180(4), the compression of the resilient members 190(1)-190(4) is minimized when the heat sink 100 is in the second configuration B. The spacers 230(1)-230(4) prevent the heat sink 100 from traveling the entire length of the shanks 210(1)-210(4) of the screws 180(1)-180(4), and thus, minimize the impact force imparted onto the ASIC 270 by the bottom surface 130 of the base 110 of the heat sink 100 when the heat sink 100 returns to the first configuration A. Therefore, the spacers 230(1)-230(4) serve to prevent the bottom surface 130 of the base 110 of the heat sink 100 from engaging the top surface 290 of the ASIC 270 with a large enough force that will cause the BGA 310 to crack.

Turning to FIGS. 5A, 5B, 6A, and 6B, illustrated are cross-sectional views of various embodiments of the spacers 230(1)-230(4). While FIGS. 5A, 5B, 6A, and 6B illustrate only one screw 180(1) with one resilient member 190(1) and one spacer 230(1), it is to be understood that the configurations of FIGS. 5A, 5B, 6A, and 6B may be applied to the plurality of screws 180(1)-180(4), resilient members 190(1)-190(4), and spacers 230(1)-230(4) previously described. As illustrated in FIGS. 5A and 5B, the spacer 230(1) is a single uniform structure. In FIG. 5A, the spacer 230(1) is disposed around the shank 210(1) of the screw 180(1) between the screw 180(1) and the resilient member 190(1). In FIG. 5A, the spacer 230(1) is disposed around the screw 180(1) proximate to the top surface 120 of the base 110 of the heat sink 100. As previously stated with reference to FIG. 4, the spacer 230(1) is sized so that a gap of the length of D2 (5-8 mils) is positioned between the top of the spacer 230(1) and the head 200(1) of the screw 180(1). This gap D2 enables the heat sink 100 to travel the length of the screw 180(1) until the head 200(1) of the screw 180(1) is disposed against the spacer 230(1). The spacer 230(1) illustrated in FIG. 5A is rigid. Therefore, once the head 200(1) of the screw 180(1) contacts the spacer 230(1), the spacer 230(1) does not deform, and prevents the heat sink 100 from traveling any further along the length of the shank 210(1) of the screw 180(1) to further compress the resilient member 190(1). The rigid spacer 230(1) is constructed to be impact resistant and have either no compressibility or a minimum amount of compressibility. Thus, the rigid spacer 230(1) illustrated in FIG. 5A may be constructed from various rigid materials, such as nylon or aluminum. A spacer 230(1) constructed from a material with properties similar to that of aluminum will have a higher impact resistance than that of a spacer 230(1) constructed from a material with properties similar to that of nylon. However, spacers 230(1) constructed from materials that have a higher degree of impact resistance may be more expensive. The degree of impact resistance of the spacer 230(1) to be used with the heat sink 100 will depend on the spring force of the resilient member 190(1), the maximum temperature of the heat sink 100, the size of the heat sink 100, and the material of the heat sink 100.

Conversely, the spacer 230(1) illustrated in FIG. 5B may be a compressible spacer 230(1) that is less rigid than the spacer 230(1) illustrated in FIG. 5A. As illustrated in FIG. 5B, the spacer 230(1) extends from the top surface 120 of the base 110 to the head 200(1) of the screw 180(1). This spacer 230(1) is dissipative in nature, in that the spacer 230(1) is configured to dissipate the forces transmitted to the heat sink 100. When external forces are imparted onto the heat sink 100 causing the heat sink 100 to travel along the shank 210(1) of the spacer 230(1), the spacer 230(1) illustrated in FIG. 5B is configured to compress and/or absorb the force of the moving heat sink 100. Thus, even though the spacer 230(1) is sized to span the distance between the head 200(1) of the screw 180(1) and the top surface 120 of the base 110 of the heat sink 100, the spacer 230(1) is configured to at least slightly compress to absorb the forces causing the heat sink 100 to transfer along the length of the shank 210(1) of the screw 180(1). The spacer 230(1) illustrated in FIG. 5A may be constructed from a material with properties that are compressible, but that only allow the head 200(1) of the screw 180(1) and the top surface 120 of the base 110 of the heat sink 100 to move closer to each other by approximately 5-8 mils. Thus, like the spacer 230(1) illustrated in FIG. 5A, the embodiment of the spacer 230(1) illustrated in FIG. 5B prevents the heat sink 100 from traveling too far along the shank 210(1) of the screw 180(1), but accomplishes this by being compressible, rather than being rigid. In addition, the spacers may be composed of materials that contain linear or substantially non-linear stress-strain properties (modulus of elasticity). Further, the spacers may be composed of materials with linear or substantially non-linear shear stress-rate of shear stress properties. This material selection would allow, for instance, the deformation of spacers to be specified to react differently based on the temporal and magnitude characteristics of the forces applied heat sink assembly 100. For example, a sudden or substantially instantaneous force increase could be reacted to differently by the spacers than a more gradual increase in the magnitude of the force.

Figure 6A:
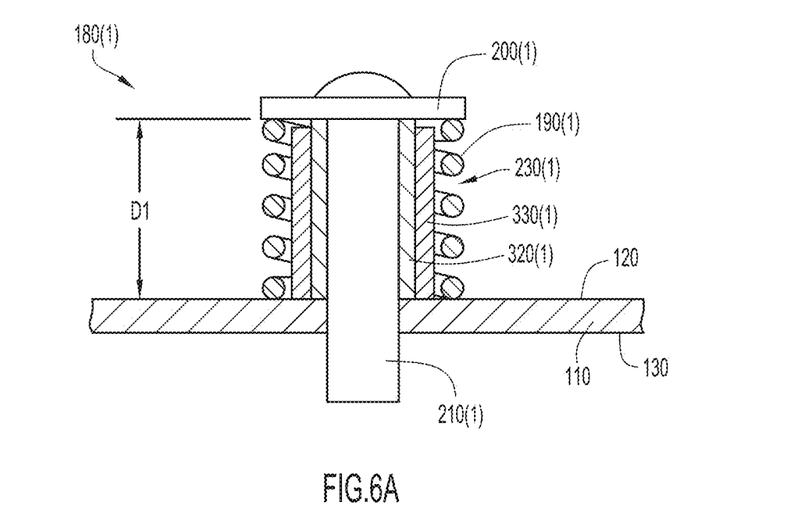
FIG. 6A illustrates a cross sectional view of a third example embodiment of a screw, spacer, and resilient member of the heat sink illustrated in FIG. 1, where the spacer includes a first spacer element and a second spacer element oriented in parallel, according to an example embodiment.
Figure 6B:
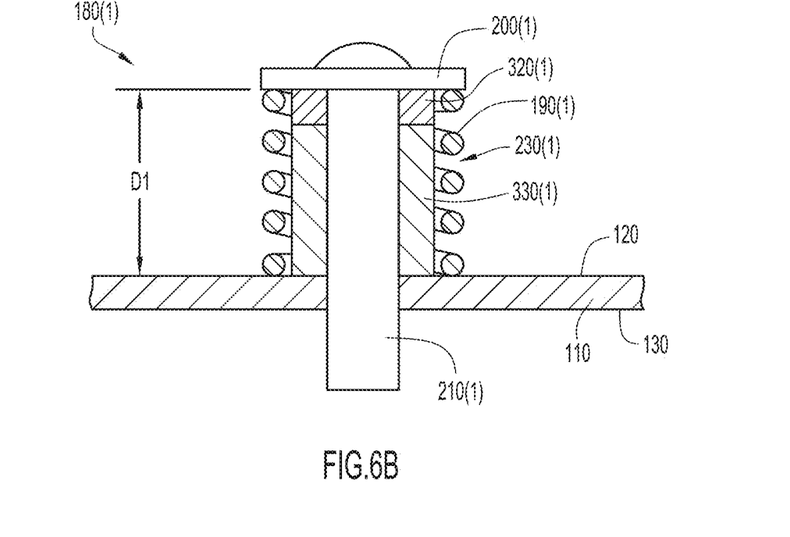
FIG. 6B illustrates a cross sectional view of a fourth example embodiment of a screw, spacer, and resilient member of the heat sink illustrated in FIG. 1, where the spacer includes a first spacer element and a second spacer element oriented in series, according to an example embodiment.

Illustrated in FIGS. 6A and 6B are spacers 230(1) that contain two spacer elements or components, a first spacer element 320(1) and a second spacer element 330(1). As illustrated in FIGS. 6A and 6B, the first and second spacer elements 320(1), 330(1) are disposed around the shank 210(1) of the screw 180(1) between the head 200(1) of the screw 180(1) and the top surface 120 of the base 110 of the heat sink 100. Moreover, the first and second spacer elements 320(1), 330(1) are disposed between the shank 210(1) of the screw 180(1) and the resilient member 190(1). FIG. 6A illustrates the spacer 230(1) with the first spacer element 320(1) in parallel with the second spacer element 330(1). As illustrated, the first spacer element 320(1) is disposed proximate the shank 210(1) of the screw 180(1) with the second spacer element 330(1) disposed around the outside of the first spacer element 320(1). In another embodiment, the second spacer element 330(1) may be disposed proximate the shank 210(1) with the first spacer element 320(1) disposed around the outside of the first spacer element 320(1). Conversely, FIG. 6B illustrates the spacer 230(1) with the first spacer element 320(1) arranged in series with the second spacer element 330(1). As illustrated in FIG. 6B, the first spacer element 320(1) is disposed proximate to the head 200(1) of the screw 180(1), while the second spacer element 330(1) is disposed proximate to the top surface 120 of the base 110 of the heat sink 100. In another embodiment, the second spacer element 330(1) may be disposed proximate to the head 200(1) of the screw 180(1), while the first spacer element 320(1) may be disposed proximate to the top surface 120 of the base 110 of the heat sink 100. The first and second spacer elements 320(1), 330(1) may have different spring constants, making one spacer element more compressible than the other spacer element. It then follows that one of the spacer elements is more rigid than the other spacer element.

FIG. 6A illustrates the spacer 230(1) with spacer elements 320(1), 330(1) arranged in parallel with one another. As illustrated, the first spacer element 320(1) spans the distance between the top surface 120 of the base 110 of the heat sink 100 and the head 200(1) of the screw 180(1). Moreover, the second spacer element 330(1) does not span the distance between the top surface 120 of the base 110 of the heat sink 100 and the head 200(1) of the screw 180(1). The first and second spacer elements 320(1), 330(1) may be constructed from different materials, which results in the first spacer element 320(1) having a lower spring constant than the second spacer element 330(1). Thus, the first spacer element 320(1) is more compressible than the second spacer element 330(1), and the second spacer element 330(1) is more rigid than the first spacer 320(1). The first spacer element 320(1) is configured to compress and absorb the forces causing the heat sink 100 to move along the length of the shank 210(1) of the screw 180(1) until the head 200(1) of the screw 180(1) reaches the second spacer element 330(1). Depending on the spring constant of the second spacer element 330(1), the rigidity of the second spacer element 330(1) may prevent further compression of the first spacer element 320(1) and prevents the head 200(1) of the screw 180(1) and the top surface 120 of the base 110 of the heat sink 100 from moving closer together. The spring constant of the second spacer element 330(1) may also allow for a degree of compressibility, where both the first and second spacer elements 320(1), 330(1) may be compressed, but the first spacer element 320(1) will be compressed more than the second spacer element 330(1). However, the spring constants of the first spacer element 320(1) and the second spacer element 330(1) may be tuned/adjusted to prevent the top surface 120 of the base 110 of the heat sink 100 and the head 200(1) of the screw 180(1) from moving towards each other by more than 5-8 mils.

FIG. 6B illustrates the spacer 230(1) with spacer elements 320(1), 330(1) arranged in series with one another. As illustrated, the second spacer 330(1) spans the majority of the distance between the top surface 120 of the base 110 of the heat sink 100 and the head 200(1) of the screw 180(1), while the first spacer element 320(1) spans the remaining distance from the end of the second spacer element 330(1) to the head 200(1) of the screw 180(1). The first and second spacer elements 320(1), 330(1) may be constructed from different materials that results in the first spacer element 320(1) having a lower spring constant than the second spacer element 330(1). Thus, the first spacer element 320(1) is more compressible than the second spacer element 330(1), and the second spacer element 330(1) is more rigid than the first spacer 320(1). The first spacer element 320(1) is configured to compress and absorb the majority of the forces causing the heat sink 100 to move along the length of the shank 210(1) of the screw 180(1) until the head 200(1) of the screw 180(1) is disposed proximate to the second spacer element 330(1). The spring constant of the second spacer element 330(1) may be of a value that prevents compression, and thus, prevents the top surface 120 of the base 110 of the heat sink 100 from moving closer to the head 200(1) of the screw 180(1). The spring constant of the second spacer element 330(1) may also allow for a small degree of compressibility, the degree of compressibility being smaller than that of the first spacer element 320(1). Thus, the combination of the first spacer element 320(1) compressing and the second spacer element 330(1) compressing prevents the top surface 120 of the base 110 of the heat sink 100 and the head 200(1) of the screw 180(1) from moving any further towards each other. The spring constants of the first and second spacer elements 320(1), 330(1) may be tuned so that the maximum distance the top surface 120 of the base 110 of the heat sink 100 may move toward the head 200(1) of the spring 180(1) is a distance of approximately 5-8 mils.

The spacers 230(1)-230(4) may be machined to any desirable length that is necessary to prevent the heat sink 100 from impacting the ASIC 270 with enough force to crack the BGA 310 when external forces are imparted onto the line card 250. Moreover, the spacers 230(1)-230(4) are generally constructed from common materials and are easy to manufacture. Thus, the spacers 230(1)-230(4) provide an insignificant cost impact to the overall cost of a heat sink. In addition, the spacers 230(1)-230(4) can be retrofitted onto all existing screw loaded heat sinks designs by simply being disposed around the shank of the screws that secure the heat sink to the PCB. Because of their small size, the spacers 230(1)-230(4) are lightweight and do not increase the overall weight of the heat sink. As explained previously, the spacers 230(1)-230(4) may be substantially cylindrical in shape, and are configured to be easily assembled around the screws of a heat sink. By placing the spacers 230(1)-230(4) proximate to the top surface of the base of the heat sinks, the airflow underneath the heat sink is not restricted and is substantially similar to that of a heat sink without the spacers 230(1)-230(4). Thus, the placement of the spacers 230(1)-230(4) does not increase any thermal resistance nor reduce thermal performance of the heat sink.

Figure 7:
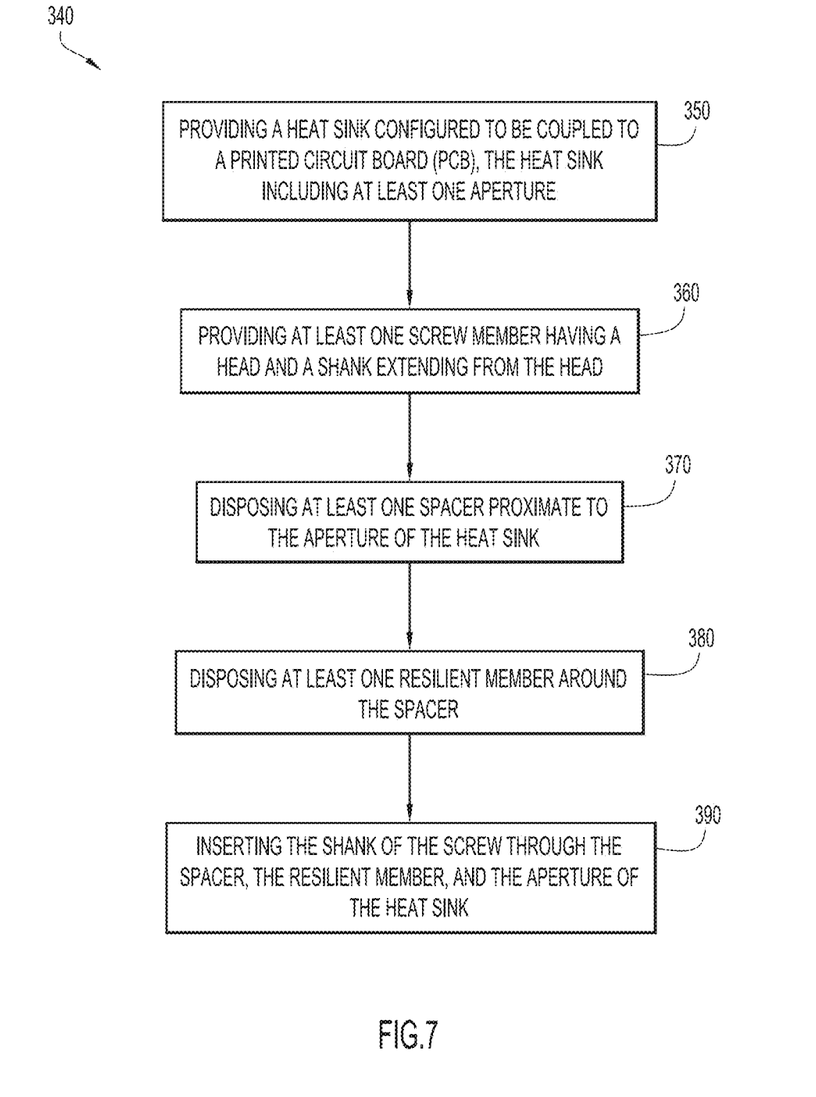
FIG. 7 shows a flow chart depicting operations of the heat sink illustrated in FIG. 1 to prevent excess force from shock and vibrations being sent to an application specific integrated circuit, according to an example embodiment.

Turning to FIG. 7, illustrated is a flow chart of a method 340 for the use of the spacers on a heat sink to prevent the cracking of a BGA when the device on which the heat sink is deployed is subjected to external forces. At 350, a heat sink is provided, where the heat sink is configured to be coupled to a PCB. The heat sink includes at least one aperture. At 360, at least one screw is provided, where the at least one screw has a head and a shank extending from the head. At 370, at least one spacer is disposed proximate to the aperture of the heat sink. At 380, at least one resilient member is disposed around the at least one spacer proximate to the aperture of the heat sink. Finally, at 390, the shank of the screw is inserted through the resilient member, the spacer, and the aperture of the heat sink, so that the end of the shank opposite the head is coupled to the PCB. Thus, the heat sink is secured to a PCB over an ASIC that is coupled to the PCB by a BGA.

In one embodiment, an apparatus includes a heat sink, at least one screw member, at least one spacer, and at least one resilient member. The heat sink may be configured to be coupled to a printed circuit board, and may include at least one aperture. The at least one screw member may include a head and a shank extending from the head. The shank of the at least one screw member may be insertable into the at least one aperture of the heat sink. The shank may have a first length. The at least one spacer may be disposed around the shank of the at least one screw member proximate to the at least one aperture. In addition, the at least one spacer may have a second length that is less than the first length of the shank. The at least one spacer may also include a first spacer element and a second spacer element that are in series with one another. The at least one resilient member may be disposed around the shank of the at least one screw member and the at least one spacer such that the first spacer element and the second spacer element are disposed around the shank of the at least one screw member between the at least one resilient member and the shank. The heat sink may be configured to move along the shank of the at least one screw member between a first position and a second position. In the first position, the heat sink may be disposed proximate the printed circuit board. In the second position, the heat sink may be disposed away from the printed circuit board. The at least one spacer may be configured to limit movement of the heat sink along the shank to a distance equal to a difference between the first length and the second length.

The resilient member of the apparatus may be configured to bias the heat sink towards the first position. Furthermore, the first spacer element may have a first stiffness, while the second spacer element may have a second stiffness that is less than the first stiffness of the first spacer element. The first spacer element may be rigid and the second spacer element may be compressible. The difference between the first length and the second length may be a first distance. The at least one spacer may be configured to compress to a third length that is less than the first length and the second length, and may be configured to limit movement of the heat sink along the shank to a second distance that is equal to a difference between the first length and the third length. The at least one aperture of the heat sink may have a first diameter, the shank may have a second diameter, and the at least one spacer may have an outermost third diameter and an innermost fourth diameter. The outermost third diameter may be larger than the first diameter and the second diameter, and the innermost fourth diameter may be smaller than the outermost third diameter and larger than the second diameter.

In another embodiment, a method includes providing a heat sink configured to be coupled to a printed circuit board, where the heat sink may include at least one aperture, and providing at least one screw member having a head and a shank extending from the head. The shank may have a first length. The method may further include disposing at least one spacer proximate to the aperture of the heat sink. The at least one spacer may have a second length that is less than the first length of the shank. Moreover, the at least one spacer may include a first spacer element and a second spacer element that are in series with one another. The method may also include disposing at least one resilient member around the at least one spacer, and inserting the shank of the at least one screw member through the at least one spacer, the resilient member, and the aperture of the heat sink. The heat sink may be configured to move along the shank of the at least one screw member between a first position and a second position. In the first position, the heat sink may be disposed proximate the printed circuit board. In the second position, the heat sink may be disposed away from the printed circuit board. The at least one spacer may be configured to limit movement of the heat sink along the shank to a distance equal to a difference between the first length and the second length.

The resilient member may be configured to bias the heat sink towards the first position. The first spacer element may have a first stiffness, while the second spacer element has a second stiffness that is less than the first stiffness of the first spacer element. The first spacer element may be rigid, while the second spacer element may be compressible. The difference between the first length and the second length may be a first distance. The at least one spacer may be configured to compress to a third length that is less than the first length and the second length, and may be configured to limit movement of the heat sink along the shank to a second distance that is equal to a difference between the first length and the third length. Moreover, inserting the shank of the at least one screw member through the at least one spacer, the resilient member, and the aperture of the heat sink may dispose the first spacer element and the second spacer element around the shank of the at least one screw member such that the first spacer element and the second spacer element are positioned between the resilient member and the shank of the at least one screw.

In yet another embodiment, an apparatus includes a heat sink, at least one screw member, and at least one spacer. The heat sink may be configured to be coupled to a printed circuit board, and may include at least one aperture. The at least one screw member may be disposed at least partially within the at least one aperture of the heat sink. The at least one screw member may also have a first length. The at least one spacer may be disposed around a portion of the at least one screw member proximate the at least one aperture of the heat sink. The at least one spacer may have a second length that is less than the first length. Furthermore, the at least one spacer may include a first spacer element and a second spacer element that are in series with one another. The heat sink may be configured to move along the at least one screw member between a first position and a second position. In the first position, the heat sink may be disposed proximate to the printed circuit board. In the second position, the heat sink may be disposed away from the printed circuit board. The at least one spacer may be configured to limit movement of the heat sink along the at least one screw member to a distance equal to a difference between the first length and the second length.

This embodiment of the apparatus may further include a resilient member disposed around the at least one spacer and the portion of the at least one screw member. The resilient member may be configured to bias the heat sink towards the first position. The first spacer element may have a first stiffness, and the second spacer element may have a second stiffness that is less than the first stiffness of the first spacer element. The first spacer element may be rigid, and the second spacer element may be compressible. The difference between the first length and the second length may be a first distance. The at least one spacer may be configured to compress to a third length that is less than the first length and the second length, and may be configured to limit movement of the heat sink along the at least one screw member to a second distance that is equal to a difference between the first length and the third length.

The above description is intended by way of example only. Although the disclosed inventions are illustrated and described herein as embodied in one or more specific examples, it is nevertheless not intended to be limited to the details shown, since various modifications and structural changes may be made therein without departing from the scope of the inventions and within the scope and range of equivalents of the claims. In addition, various features from one of the embodiments may be incorporated into another of the embodiments. Accordingly, it is appropriate that the appended claims be construed broadly and in a manner consistent with the scope of the disclosure as set forth in the following claims.

What is claimed is:

1. An apparatus comprising:
    a heat sink configured to be coupled to a printed circuit board, the heat sink including at least one aperture;
    at least one screw member, the at least one screw member comprising:
    a head, and
    a shank extending from the head and being insertable into the at least one aperture of the heat sink, the shank having a first length;
    at least one spacer disposed around the shank of the at least one screw member proximate to the at least one aperture, the at least one spacer having a second length that is less than the first length of the shank, the at least one spacer including a first spacer element and a second spacer element that are in series with one another; and
    at least one resilient member disposed around the shank of the at least one screw member and the at least one spacer such that the first spacer element and the second spacer element are disposed around the shank of the at least one screw member between the at least one resilient member and the shank,
    wherein the heat sink is configured to move along the shank of the at least one screw member between a first position where the heat sink is disposed proximate the printed circuit board, and a second position where the heat sink is disposed away from the printed circuit board, and wherein the at least one spacer is configured to compress to a third length that is less than the first length and the second length, and wherein the at least one spacer is configured to limit movement of the heat sink along the shank to a distance equal to a difference between the first length and the third length.

2. The apparatus of claim 1, wherein the at least one resilient member is configured to bias the heat sink towards the first position.

3. The apparatus of claim 1, wherein the first spacer element has a first stiffness.

4. The apparatus of claim 3, wherein the second spacer element has a second stiffness that is less than the first stiffness of the first spacer element.

5. The apparatus of claim 4, wherein the first spacer element is rigid and the second spacer element is compressible.

6. The apparatus of claim 1, wherein the at least one aperture has a first diameter, the shank has a second diameter, and the at least one spacer has an outermost third diameter and an innermost fourth diameter, the outermost third diameter being larger than the first diameter and the second diameter, the innermost fourth diameter being smaller than the outermost third diameter and larger than the second diameter.

7. A method comprising:
    providing a heat sink configured to be coupled to a printed circuit board, the heat sink including at least one aperture;
    providing at least one screw member having a head and a shank extending from the head, the shank having a first length;
    disposing at least one spacer proximate to the at least one aperture of the heat sink, the at least one spacer having a second length that is less than the first length of the shank, the at least one spacer including a first spacer element and a second spacer element that are in series with one another;
    disposing at least one resilient member around the at least one spacer; and
    inserting the shank of the at least one screw member through the at least one spacer, the at least one resilient member, and the at least one aperture of the heat sink, wherein the heat sink is configured to move along the shank of the at least one screw member between a first position where the heat sink is disposed proximate the printed circuit board, and a second position where the heat sink is disposed away from the printed circuit board, wherein the at least one spacer is configured to compress to a third length that is less than the first length and the second length, and wherein the at least one spacer is configured to limit movement of the heat sink along the shank to a distance equal to a difference between the first length and the third length.

8. The method of claim 7, wherein the at least one resilient member is configured to bias the heat sink towards the first position.

9. The method of claim 7, wherein the first spacer element has a first stiffness.

10. The method of claim 9, wherein the second spacer element has a second stiffness that is less than the first stiffness of the first spacer element.

11. The method of claim 10, wherein the first spacer element is rigid and the second spacer element is compressible.

12. The method of claim 7, wherein inserting the shank of the at least one screw member through the at least one spacer, the at least one resilient member, and the at least one aperture of the heat sink disposes the first spacer element and the second spacer element around the shank of the at least one screw member such that the first spacer element and the second spacer element are positioned between the at least one resilient member and the shank of the at least one screw member.

13. An apparatus comprising:
a heat sink configured to be coupled to a printed circuit board, the heat sink including at least one aperture;
at least one screw member disposed at least partially within the at least one aperture of the heat sink, the at least one screw member having a first length; and
at least one spacer disposed around a portion of the at least one screw member proximate the at least one aperture of the heat sink, the at least one spacer having a second length that is less than the first length, the at least one spacer including a first spacer element and a second spacer element that are in series with one another, wherein the heat sink is configured to move along the at least one screw member between a first position where the heat sink is disposed proximate the printed circuit board, and a second position where the heat sink is disposed away from the printed circuit board, wherein the at least one spacer is configured to compress to a third length that is less than the first length and the second length, and wherein the at least one spacer is configured to limit movement of the heat sink along the at least one screw member to a distance equal to a difference between the first length and the third length.

14. The apparatus of claim 13, further comprising:
a resilient member disposed around the at least one spacer and the portion of the at least one screw member, the resilient member configured to bias the heat sink towards the first position.

15. The apparatus of claim 13, wherein the first spacer element has a first stiffness.

16. The apparatus of claim 15, wherein the second spacer element has a second stiffness that is less than the first stiffness of the first spacer element.

17. The apparatus of claim 16, wherein the first spacer element is rigid and the second spacer element is compressible.

18. The apparatus of claim 13, wherein the at least one aperture has a first diameter, the portion of the at least one screw member has a second diameter, and the at least one spacer has an outermost third diameter and an innermost fourth diameter, the outermost third diameter being larger than the first diameter and the second diameter, the innermost fourth diameter being smaller than the outermost third diameter and larger than the second diameter.

19. The apparatus of claim 17, wherein the first spacer element is disposed atop the second spacer element such that the second spacer element is disposed more proximate to the at least one aperture of the heat sink than to the first spacer element.

20. The apparatus of claim 5, wherein the first spacer element is disposed atop the second spacer element such that the second spacer element is disposed more proximate to the at least one aperture of the heat sink than to the first spacer element.

* * * * *